(12) United States Patent
Popp et al.

(10) Patent No.: US 8,203,205 B2
(45) Date of Patent: Jun. 19, 2012

(54) POWER SEMICONDUCTOR MODULE HAVING A SUBSTRATE AND A PRESSURE DEVICE

(75) Inventors: Rainer Popp, Petersaurach (DE); Markus Gruber, Altdorf (DE)

(73) Assignee: Semikron Elektronik GmbH & Co, KG, Nürnberg (DE)

( * ) Notice: Subject to any disclaimer, the term of this patent is extended or adjusted under 35 U.S.C. 154(b) by 108 days.

(21) Appl. No.: 12/313,125

(22) Filed: Nov. 17, 2008

(65) Prior Publication Data

US 2009/0134482 A1    May 28, 2009

(30) Foreign Application Priority Data

Nov. 16, 2007   (DE) .......................... 10 2007 054 709

(51) Int. Cl.
*H01L 23/22* (2006.01)
*H01L 21/00* (2006.01)
(52) U.S. Cl. ........................................ 257/687; 438/123
(58) Field of Classification Search .................. 257/687, 257/E23.01–E23.079; 438/121–123
See application file for complete search history.

(56) References Cited

U.S. PATENT DOCUMENTS

| | | | |
|---|---|---|---|
| 4,772,210 A | 9/1988 | Venaleck | |
| 6,059,615 A | 5/2000 | Pendelton et al. | |
| 6,483,128 B2 | 11/2002 | Loddenkötter et al. | |
| 6,507,102 B2 * | 1/2003 | Juskey et al. | 257/706 |
| 6,870,738 B2 * | 3/2005 | Goebl | 361/719 |
| 7,592,698 B2 | 9/2009 | Lederer et al. | |
| 2004/0242031 A1 * | 12/2004 | Gobl et al. | 439/73 |
| 2007/0194443 A1 * | 8/2007 | Lederer et al. | 257/723 |

FOREIGN PATENT DOCUMENTS

| | | |
|---|---|---|
| DE | 197 19 703 | 11/1998 |
| DE | 199 03 875 | 8/2000 |
| DE | 100 08 572 | 9/2001 |
| DE | 101 27 947 | 1/2002 |
| DE | 695 31 996 | 7/2004 |
| DE | 10 2006 006 424 | 8/2007 |
| EP | 0 784 342 | 7/1997 |
| EP | 1 592 063 | 11/2005 |

* cited by examiner

*Primary Examiner* — Calvin Lee

(74) *Attorney, Agent, or Firm* — The Law Offices of Roger S. Thompson

(57) ABSTRACT

A power semiconductor module having a substrate, a housing and a pressure device. The substrate further includes a body formed of an insulating material and structured conductor tracks which are arranged thereon and have load and auxiliary potentials. The substrate also includes recesses in the region of the structured conductor tracks in at least two areas that are not covered by a power semiconductor component. Furthermore, the pressure device has latching lugs, which are disposed in the recesses and are arranged therein in a form-fitting and/or frictional manner, at least two points on the side of the pressure device which faces the substrate.

14 Claims, 5 Drawing Sheets

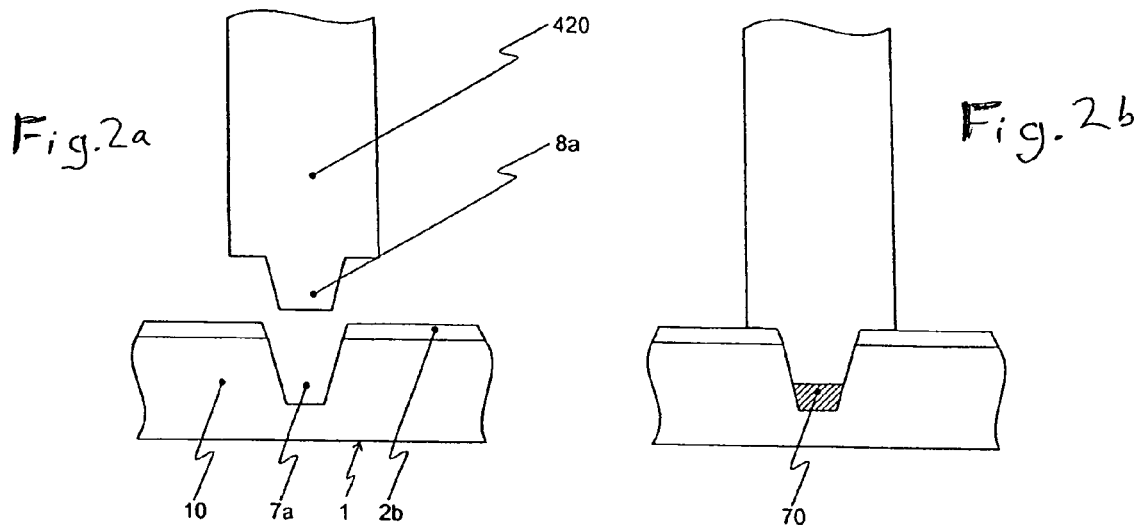
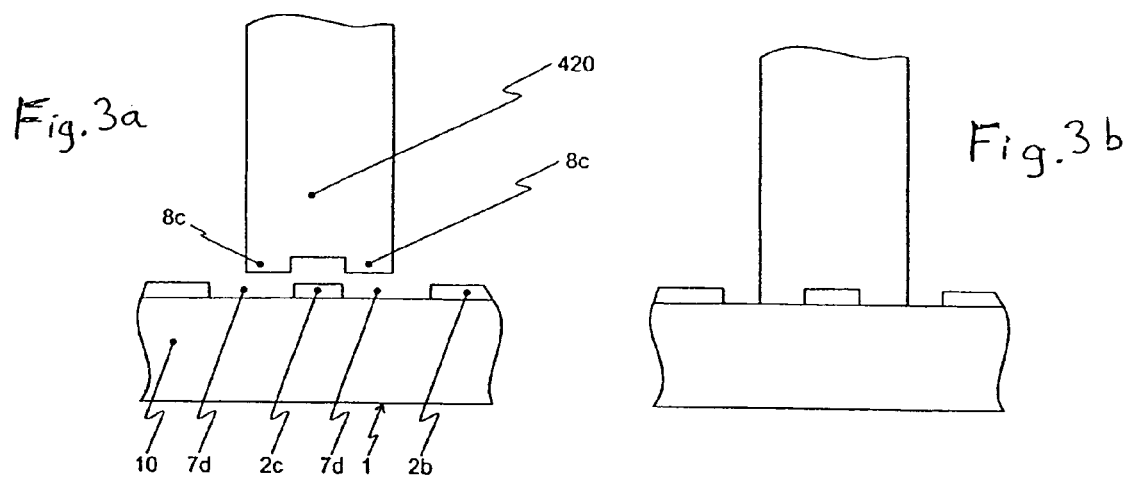

7a   2a   3a   10   7b   2b

POWER SEMICONDUCTOR MODULE HAVING A SUBSTRATE AND A PRESSURE DEVICE

BACKGROUND OF THE INVENTION

1. Field of the Invention

The invention is directed to a power semiconductor module and more particularly to a compact pressure-contact-connected power semiconductor module without a base plate and having a frame-like insulating housing, with at least one substrate and a pressure device.

2. Description of the Related Art

Known power semiconductor modules as shown, for example, in German Patent No. DE 197 19 703 A1. According to the prior art, such power semiconductor modules comprise a housing having at least one electrically insulating substrate which is arranged in the housing and is preferably intended to be directly mounted on a cooling component. The substrate, for its part, comprises a body made of an insulating material having a plurality of structured metal connecting tracks, which are situated thereon and are insulated from one another, and having power semiconductor components which are situated on the tracks and are connected to these connecting tracks in a circuit-compliant manner. Furthermore, known power semiconductor modules have connection elements for external load and auxiliary connections as well as connecting elements which are arranged in the interior thereof.

Other known pressure-contact-connected power semiconductor modules, are disclosed in German Patent Nos. DE 199 03 875 A1 and DE 101 27 947 C1.

The module disclosed in German Patent No. 199 03 875 A1 has a pressure device comprising a stable pressure element for introducing pressure. The element has an advantageous ratio of weight and stability and, for this purpose, is in the form of a shaped plastic body with an internal metal core and also has electrically insulating bushings.

Furthermore, the pressure device has an elastic cushion element for storing pressure and a bridge element for introducing pressure into separate regions of the substrate surface. In this case, the elastic cushion element is used to maintain constant pressure conditions under different thermal loads and over the entire life cycle of the power semiconductor module. The bridge element is preferably in the form of a shaped plastic body having an area which faces the cushion element and from which a multiplicity of pressure fingers extend towards the substrate surface. Such a pressure device is preferably used to urge the substrate onto a cooling component and hence to reliably produce permanent heat transfer between the substrate and the cooling component.

German Patent No. DE 101 27 947 C1 discloses a further power semiconductor module, the load connection elements of which are designed so that sections of them run very close to one another at right angles to the substrate surface and have internal contacts which extend therefrom, make electrical contact with the conductor tracks and simultaneously exert pressure on the substrate. Thus they preferably establish thermal contact between the substrate and a cooling component. In this case, the pressure is introduced, by way of example, using the above-mentioned means according to the prior art.

The disadvantage of power semiconductor modules which are formed in this manner without a base plate is that, during the pressure-introducing contact-connection of the internal contact devices to the conductor tracks of the substrate, the electrically insulating substrate may rotate with respect to the frame-like housing in the mounting process as a result of the lack of a base plate. The force caused by rotating the substrate with respect to the housing may damage the substrate during mounting and thus cause a loss of performance, including the possible destruction of the power semiconductor module.

Another disadvantage of such power semiconductor modules having spring contact elements as the load and auxiliary connection elements is that the internal contacts of these spring contact elements may laterally slide off the structured conductor track as a result of the introduction of pressure and give rise to a loss of contact which may result in reduced performance of the power semiconductor module and, in the extreme case, to the total failure of the module.

SUMMARY OF THE INVENTION

It is therefore an object of the invention to present a power semiconductor module having a pressure device and a substrate, in which the substrate is secured against rotation in the mounting process so that the power semiconductor module may be produced more simply and cost-effectively than heretofore.

The inventive power semiconductor module has a substrate with at least one power semiconductor component, which is to be arranged and connected in a circuit-compliant manner, and has a housing with a pressure device and load connection elements and auxiliary connection elements which lead to the outside. The substrate has an insulating material body, and structured conductor tracks with a load potential arranged on the main area of the body which faces the interior of the power semiconductor module. The substrate also has structured conductor tracks with an auxiliary potential for driving the power semiconductor components.

The pressure device comprises a pressure-introducing pressure element, which preferably simultaneously forms the cover of the housing, and also preferably a bridge element for introducing pressure into conductor tracks arranged on the substrate. The bridge element has channel-like recesses through which load connection elements, and also preferably a plurality of pressure fingers, may pass in the direction of the substrate surface. The pressure device also preferably has a resilient cushion element for storing pressure and for maintaining constant pressure across the element. By way of example, the pressure-introducing element and the bridge element may also be integral without a cushion element. In one embodiment, the bridge element may likewise be integrally formed with the frame-like housing of the power semiconductor module.

The power semiconductor module also has load connection elements formed as shaped metal bodies having external and internal contact devices. The respective external contacts of individual load connection elements are preferably arranged parallel to the substrate surface and at a distance therefrom. The internal contacts that extend from the external contact devices preferably extend at right angles to the substrate surface through channel-like recesses in the bridge element, and form the contacts of the load connections in a circuit-compliant manner. As a further preferred possible refinement, the load and auxiliary connections are arranged in the form of electrically conductive spring contact elements.

Recesses are preferably disposed on the substrate in the area of the structured conductor tracks in at least two regions which are not covered by a power semiconductor component, and latching lugs that are disposed in respective recesses and are correspondingly situated at least two points on that side of the pressure device, preferably a pressure finger of the bridge element, which faces the substrate. This sets the maximum area of a recess and the correspondingly assigned latching lug as a result of the maximum area of that side of a pressure finger which faces the substrate. In this case, the depth of a recess, and accordingly the height of a latching lug disposed in the recess, is at least 20% of the depth of the conductor track arranged on the substrate and may extend completely therethrough.

In this case, it is advantageous for the frictional connection between the contacts and the substrate to simultaneously enable the form-fitting and/or frictional connection between the at least two recesses and the at least two latching lugs respectively assigned to the latter without further effort using the pressure device, which prevents rotation of the substrate with respect to the housing.

It is also preferred that the recesses can be produced without further effort in the process of structuring the conductor tracks. Correspondingly, the latching lugs can be produced while producing the bridge element, which is preferably in the form of a plastic body.

In such a module, lateral sliding of the internal contacts of the spring contact elements can be avoided if the internal contact has a latching lug applied to its side facing the substrate and a respective recess is arranged on the substrate.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings in which like references numerals describe like elements:

FIG. 2a is a side view of an enlarged detail of a first embodiment of the power semiconductor module with the components apart;

FIG. 2b is a side view of the detail of FIG. 2a with the components in contact

FIG. 3a is a side view of an enlarged detail of a further embodiment of the inventive power semiconductor module with the components apart;

FIG. 3b is a side view of the detail of FIG. 3a with the components in contact;

DETAILED DESCRIPTION OF THE PRESENTLY PREFERRED EMBODIMENTS

Figure 1:
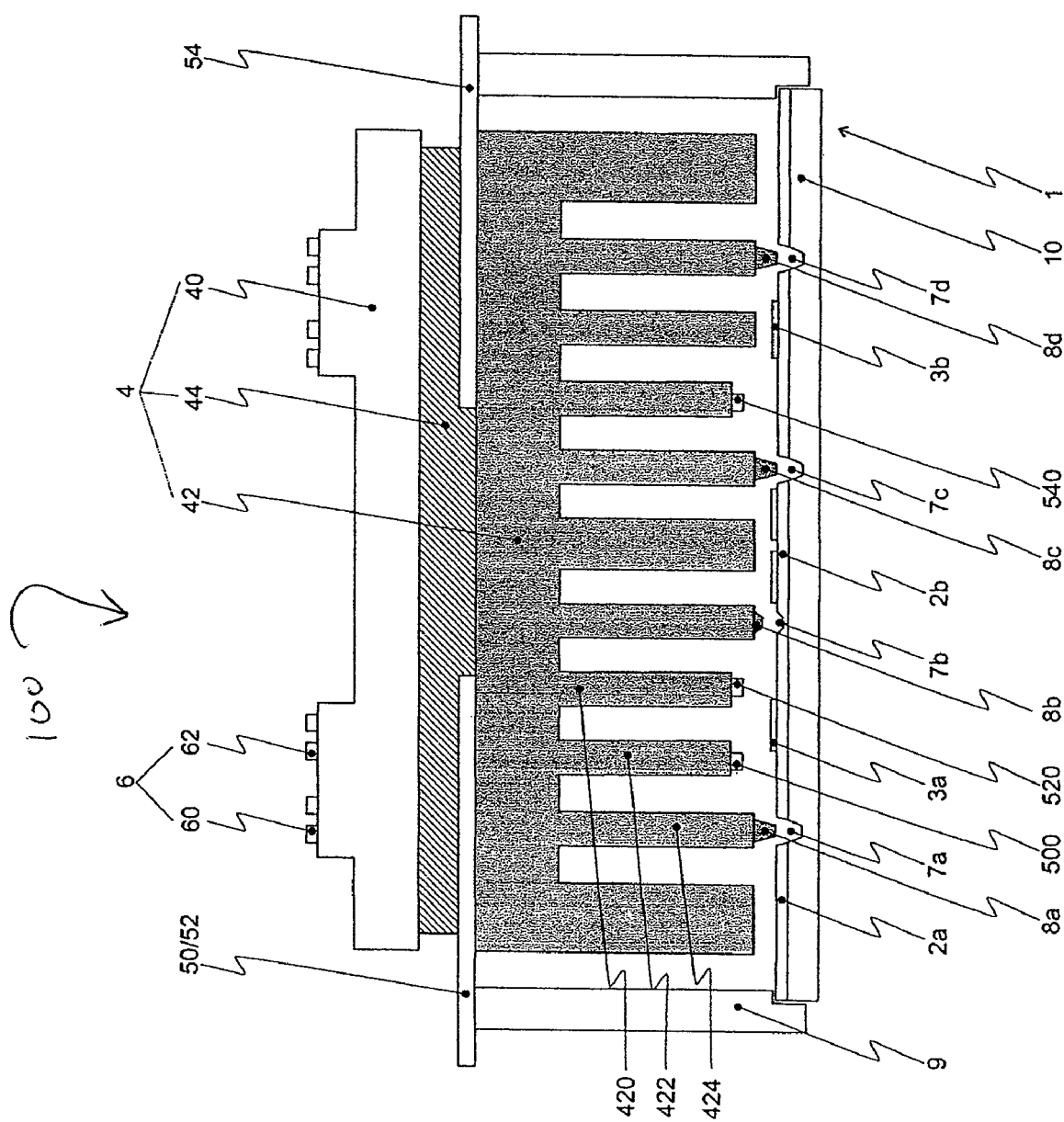
FIG. 1 is a simplified illustration of an inventive power semiconductor module.

FIG. 1 shows a simplified illustration of a power semiconductor module shown generally at 100 without a base plate and having a substrate 1. Substrate 1 includes an insulating material body 10 and structured conductor tracks 2a, 2b which are arranged on substrate 1. Power semiconductor components 3a, 3b are arranged on conductor tracks 2a, 2b, respectively. Power semiconductor module 100 further includes a pressure device 4 having a pressure-introducing element 40 and a bridge element 42. Furthermore, pressure device 4 additionally has a cushion element 44 for storing pressure and for maintaining constant pressure conditions across pressure device 4. In this case, bridge element 42 preferably comprises a plastic body having a plurality of pressure fingers 420, 422, 424 which face substrate 1. Furthermore, power semiconductor module 100 has a housing 9.

Conductor tracks 2a, 2b have load and auxiliary potentials which are used to electrically contact-connect load connections 50, 52, 54 and auxiliary connections 60, 62 which lead to the exterior of module 100. In this case, the arranged conductor tracks 2a, 2b and load and auxiliary connections can be electrically contact-connected by means of internal contacts 500, 520, 540, sections of which extend at right angles to substrate surface through channel-like recesses 7a-d in the bridge element.

Recesses 7a-d are situated in at least two regions, not covered by semiconductor components, on the structured conductor tracks of the substrate. Recesses 7a-d may be cylindrical, dome-shaped, frustoconical or cross-shaped. Furthermore, the depth of some recesses 7a, 7c, 7d is about 50% of the thickness of their respective conductor tracks and the depth of other recesses 7b is 70% of the thickness of the entire substrate.

Latching lugs 8a-d are disposed on those sides of at least one pressure finger which face substrate 1 and are accordingly disposed in respective recesses 7a-d.

FIG. 2a is a side view of an enlarged detail of a first refinement of the inventive power semiconductor module, which includes a substrate 1, and an insulating material body 10. Structured conductor tracks 2a, 2b which are arranged on substrate and having a recess 7a. Recess 7a is frustoconical in this case and has a depth of about 70% of the entire thickness of substrate 1. Also illustrated is pressure finger 420 of bridge element 42. Pressure finger 420 extends towards the surface of substrate 1. Latching lug 8a is shaped complementarily to the shape of recess 7a and produces a frictional connection to recess 7a (as shown in FIG. 2b) in conjunction with pressure device 4 (FIG. 1). In this case, the depth of the latching lug may not reach the bottom of recess 7a but rather leaves a residual volume 70 of recess 7a free.

FIG. 3a is a side view of an enlarged detail of a further refinement of the inventive power semiconductor module. In this case, pressure finger 420 has two latching lugs 8c. Two recesses 7d in which the conductor tracks 2a, 2b have accordingly been interrupted are formed on substrate 1. Latching lugs 8c are disposed in recesses 7d in such a manner that that part of conductor track 2c which remains between latching lugs 8c establishes a form-fitting or frictional connection FIG. 3b with two latching lugs 8c even though recesses 7d themselves are wider than latching lugs 8c.

Figure 4:
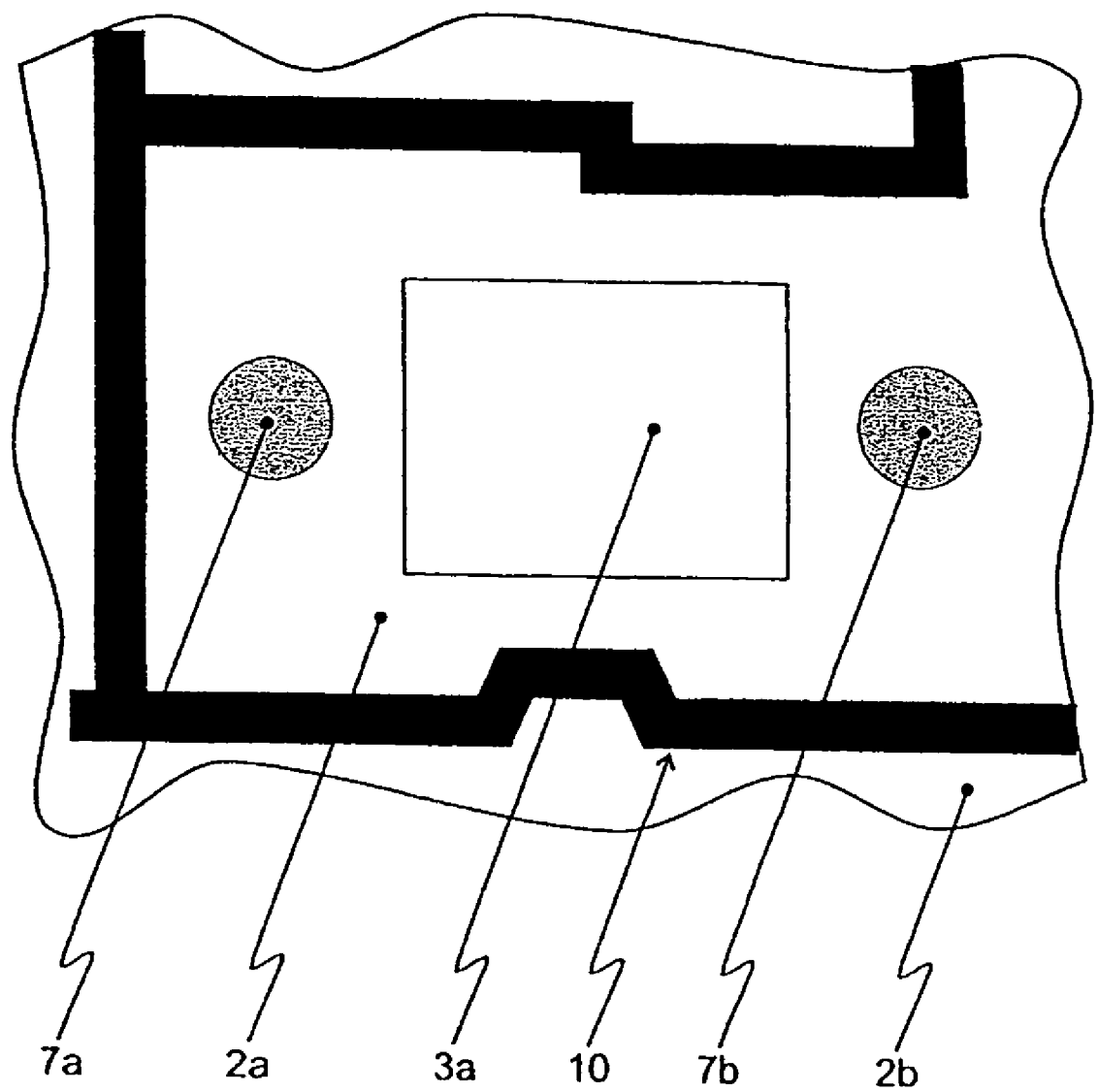
FIG. 4 is a plan view of an enlarged detail of a still further embodiment of the inventive power semiconductor module.

FIG. 4 is a plan view of a detail of substrate 1. Body 10 becomes visible in plan view only in the region of the conductor track structuring. Also illustrated is an exemplary semiconductor component 3a and two recesses 7a, 7b which are arranged in two regions that are not covered by semiconductor component 3a, on, by way of example, one structured conductor track. Recesses 7a, 7b are cylindrical in this example.

Figure 5A:
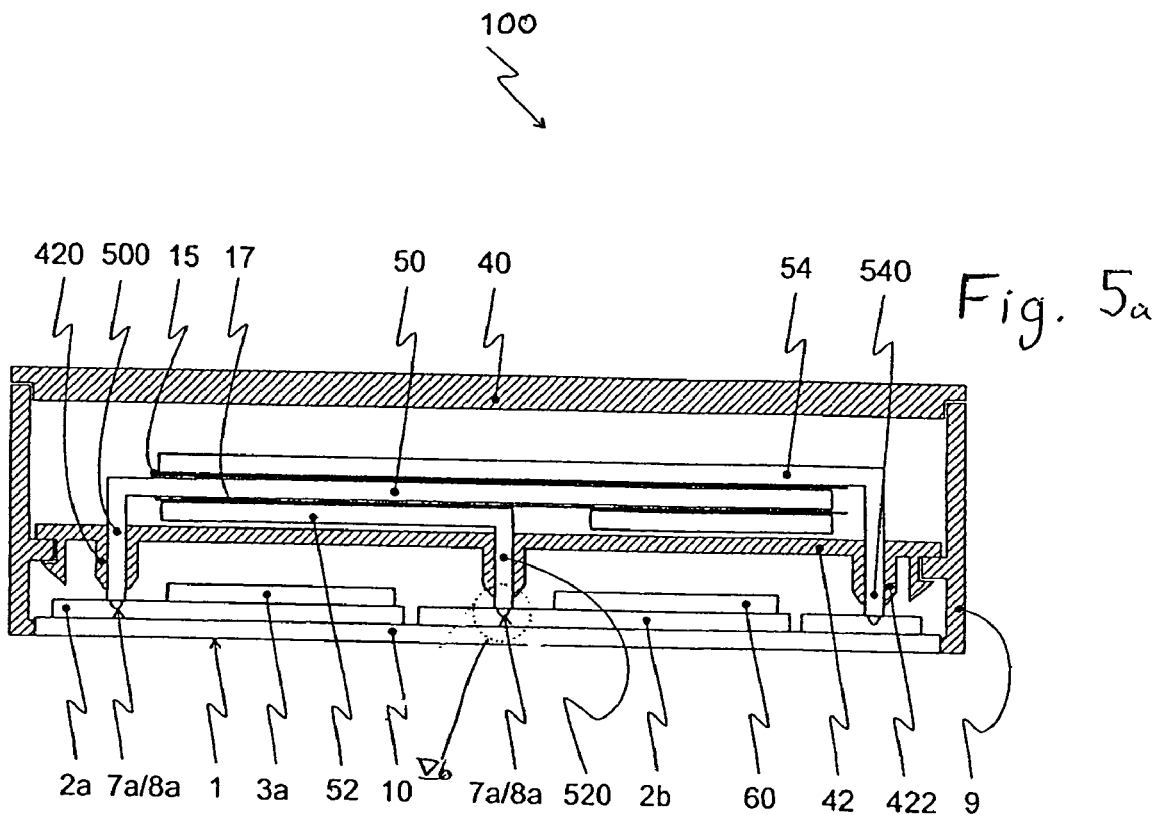
FIG. 5a is a simplified illustration of the inventive power semiconductor module having a housing.

FIG. 5 is a simplified illustration of a further embodiment of power semiconductor module 100 having a frame-like housing 9, a substrate 1, insulating material body 10, structured conductor tracks 2a, 2b arranged on substrate 1 and power semiconductor components 3a, 3b arranged on conductor tracks 2a, 2b. Furthermore, load connection elements 50, 52, 54 are shaped metal bodies which each have a strip-like section parallel to the substrate surface and form a stack. The individual load connection elements are spaced from one another by insulating layer 15, 17. Required auxiliary connection elements are not illustrated in this sectional drawing for clarity.

Figure 5B:
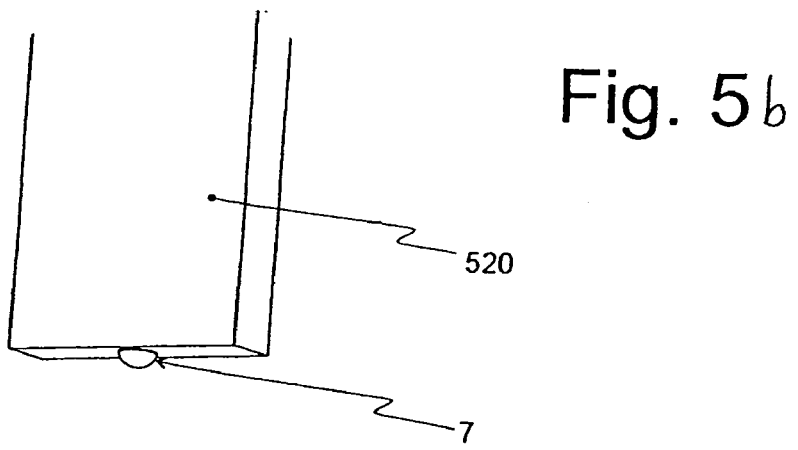
FIG. 5b is an enlarged detail of a section of FIG. 5a shown by dotted circle V b thereof.

In this case, pressure device 4 has a pressure-introducing element 40 and the load connections which introduce pressure onto the substrate. A frictional connection is produced directly using the internal contacts of the load connections on conductor tracks 2a, 2b. Recesses 7a, 7b and latching lugs 8a, 8b assigned to the latter are dome-shaped in this example (FIG. 5b). Latching lugs 8a, 8b are fitted to that side of internal contacts 500, 520, 540 of the load connections 50, 52, 54 which face the conductor tracks 2a, 2b.

Figure 6:
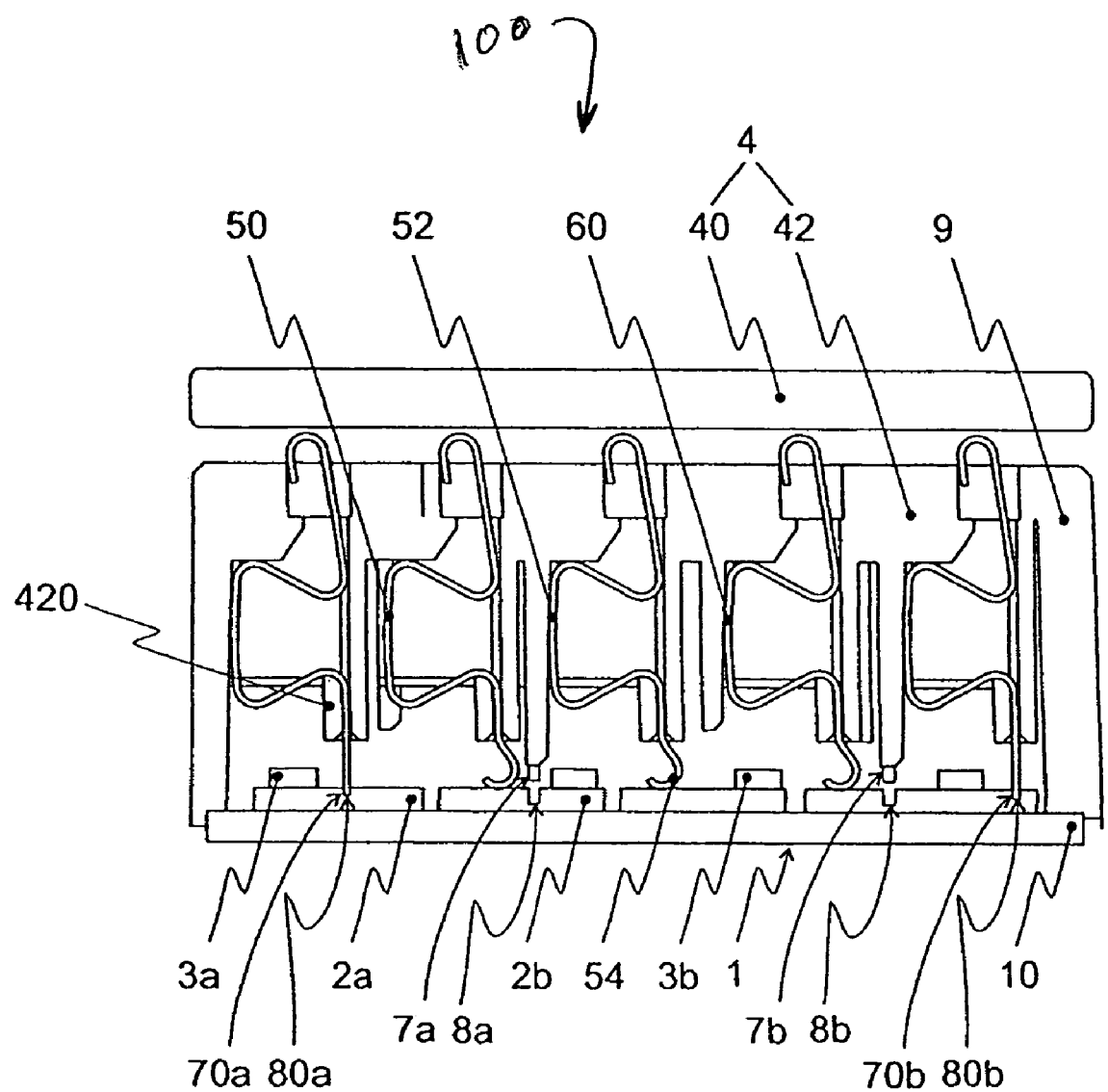
FIG. 6 is a further refinement of the inventive power semiconductor module.

FIG. 6 is a simplified illustration of a further refinement of inventive power semiconductor module 100. In this embodiment, pressure device 4 is in the form of a pressure-introducing element 40 and a bridge element 42. Bridge element 42 is integral with housing 9, and pressure device 4 is itself flexible, and therefore may dispense with a cushion element. Furthermore, load connection elements 50, 52 and auxiliary connection elements 60 are also in the form of spring contact elements, and so the electrical contact-connection to the structured conductor tracks is formed by internal contacts 54, sections of which extend at right angles to the substrate surface through channel-like recesses in the bridge element 42. Recesses 7a, 7b and latching lugs 8a, 8b are cylindrical in this embodiment and have a depth of about 30% of the thickness of the entire substrate 1.

Alternatively or additionally, latching lugs 80a, 80b are fitted to the internal contact-connections between the spring contact elements 50 and the conductor tracks, and latching lugs 80a, 80b in turn accordingly enter a form-fitting and frictional connection with respective recesses 70a, 70b. In the illustrated embodiment, latching lugs 80a, 80b may be in the form of extensions of the spring body. In the case of helical springs which are not illustrated and are formed, by way of example, from a metal wire, the internal contact-connection, which is in the form of a straight wire section, may itself form the latching lug.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module for use with at least one semiconductor component, the module comprising:
   a housing;
   a pressure device;
   load connection elements and auxiliary connection elements which lead to the outside of the housing; and
   at least one substrate having an insulating material body with a first main area which faces the interior of the power semiconductor module and conductor tracks with load and auxiliary potentials disposed on said first main area;
   wherein said main area of said substrate includes at least two recesses near said conductor tracks in at least two regions which are not covered by one of the at least one power semiconductor components;
   wherein said pressure device includes at least one latching lug disposed in one of said recesses on the side of the pressure device that faces said substrate;
   wherein the latching lugs are attached to the recesses by one of a form-fit and frictional relationship; and
   wherein said pressure-introducing pressure element forms an upper end of the power semiconductor module.

2. The power semiconductor module of claim 1,
   wherein said latching lug is shaped as one of the group consisting of:
   frustoconical, dome-shaped, cylindrical, cross-shaped and platform-shaped; and
   wherein said recess is complementarily shaped to accommodate said latching lug.

3. The power semiconductor module of claim 1,
   wherein the depth of said recesses is at least about 20% of the thickness of said substrate.

4. The power semiconductor module of claim 1,
   wherein the depth of said latching lug is at least about 20% of said thickness of said substrate.

5. The power semiconductor module of claim 1,
   wherein said pressure device includes at least one of said load connection elements.

6. A power semiconductor module for use with at least one semiconductor component, the module comprising:
   a housing;
   a pressure device;
   load connection elements and auxiliary connection elements which lead to the outside of the housing; and
   at least one substrate having an insulating material body with a first main area which faces the interior of the power semiconductor module and conductor tracks with load and auxiliary potentials disposed on said first main area;
   wherein said main area of said substrate includes at least two recesses near said conductor tracks in at least two regions which are not covered by one of the at least one power semiconductor components;
   wherein said pressure device includes at least one latching lug disposed in one of said recesses on the side of the pressure device that faces said substrate;
   wherein the latching lugs are attached to the recesses by one of a form-fit and frictional relationship; and
   wherein said pressure device includes an elastic cushion element which is disposed between a pressure-introducing pressure element and a bridge element disposed within said housing.

7. The power semiconductor module of claim 6,
   wherein said bridge element includes a plastic body having a flat partial body which faces said cushion element and from which a plurality of pressure fingers extend toward the substrate surface.

8. The power semiconductor module of claim 6,
   wherein sections of said load connection elements are disposed at right angles to said substrate surface and have, on a side facing said substrate, contacts for electrical contact-connection to said conductor tracks arranged on said substrate.

9. The power semiconductor module of claim 6,
wherein said housing laterally surrounds said bridge element and said at least one substrate in a frame-like manner.

10. The power semiconductor module of claim 6,
wherein said latching lug is shaped as one of the group consisting of:
frustoconical, dome-shaped, cylindrical, cross-shaped and platform-shaped; and
wherein said recess is complementarily shaped to accommodate said latching lug.

11. The power semiconductor module of claim 6,
wherein said pressure-introducing pressure element forms an upper end of the power semiconductor module.

12. The power semiconductor module of claim 6,
wherein the depth of said recesses is at least about 20% of the thickness of said substrate.

13. The power semiconductor module of claim 6,
wherein the depth of said latching lug is at least about 20% of said thickness of said substrate.

14. The power semiconductor module of claim 6,
wherein said pressure device includes at least one of said load connection elements.

* * * * *